United States Patent
Kandler (10) Patent No.: US 8,970,232 B2
(45) Date of Patent: *Mar. 3, 2015

(54) CAPACITIVE SENSOR ASSEMBLY

(75) Inventor: Marcus Kandler, Florssbachtal (DE)

(73) Assignee: Takata AG, Aschaffenburg (DE)

( * ) Notice: Subject to any disclaimer, the term of this patent is extended or adjusted under 35 U.S.C. 154(b) by 210 days.

This patent is subject to a terminal disclaimer.

(21) Appl. No.: 13/520,137

(22) PCT Filed: Dec. 30, 2010

(86) PCT No.: PCT/EP2010/070938
§ 371 (c)(1),
(2), (4) Date: Jun. 29, 2012

(87) PCT Pub. No.: WO2011/080324
PCT Pub. Date: Jul. 7, 2011

(65) Prior Publication Data
US 2012/0306512 A1 Dec. 6, 2012

(30) Foreign Application Priority Data
Dec. 30, 2009 (DE) .......................... 10 2009 055 426

(51) Int. Cl.
*G01R 27/26* (2006.01)
*H03K 17/955* (2006.01)
(Continued)

(52) U.S. Cl.
CPC .............. *H03K 17/955* (2013.01); *B60N 2/002* (2013.01); *H03K 17/962* (2013.01); *H03K 2017/9613* (2013.01); *H03K 2017/9615* (2013.01); *H03K 2217/96078* (2013.01)
USPC ............................ 324/686; 324/660; 324/663

(58) Field of Classification Search
USPC .................................................. 324/660–686
IPC ....................................................... B60N 2/002
See application file for complete search history.

(56) References Cited

U.S. PATENT DOCUMENTS

| 3,626,287 | A | 12/1971 | Di Niro et al. |
| 6,158,768 | A | 12/2000 | Steffens, Jr. et al. |
| 6,517,106 | B1 | 2/2003 | Stanley et al. |

(Continued)

FOREIGN PATENT DOCUMENTS

| CN | 101 108 595 A | 1/2008 |
| DE | 199 07 199 A1 | 11/1999 |

(Continued)

OTHER PUBLICATIONS

English translation of Notification of the First Office Action issued in counterpart Chinese Application No. 201080040707.5 dated Apr. 28, 2013 (9 pages).

(Continued)

*Primary Examiner* — Vincent Q Nguyen
(74) *Attorney, Agent, or Firm* — Fitch Even Tabin & Flannery, LLP (57) ABSTRACT

A capacitive sensor assembly for a motor vehicle is provided. The capacitive sensor assembly includes a capacitive sensor element which has at least one first electrical conductor element, and a reference conductor element defining an electrical reference potential and being interspaced from the first electrical conductor element. The first electrical conductor element is designed as an outer conductor surrounding the reference conductor element which represents the inner conductor.

18 Claims, 5 Drawing Sheets

(51) Int. Cl.
*B60N 2/00* (2006.01)
*H03K 17/96* (2006.01)

(56) References Cited

U.S. PATENT DOCUMENTS

| | | | |
|---|---|---|---|
| 6,563,231 | B1 | 5/2003 | Stanley et al. |
| 6,703,845 | B2 | 3/2004 | Stanley et al. |
| 7,132,642 | B2 | 11/2006 | Shank et al. |
| 7,293,467 | B2 | 11/2007 | Shank et al. |
| 7,407,029 | B2 * | 8/2008 | Breed et al. ............ 180/274 |
| 2001/0045733 | A1 | 11/2001 | Stanley et al. |
| 2003/0005775 | A1 | 1/2003 | Washeleski et al. |
| 2003/0056600 | A1 | 3/2003 | Shank et al. |
| 2004/0113634 | A1 | 6/2004 | Stanley et al. |
| 2004/0267422 | A1 | 12/2004 | Bossler et al. |
| 2005/0242965 | A1 | 11/2005 | Rieth et al. |
| 2006/0022682 | A1 | 2/2006 | Nakamura et al. |
| 2007/0089527 | A1 | 4/2007 | Shank et al. |
| 2007/0117445 | A1 | 5/2007 | Yamaura et al. |
| 2007/0200721 | A1 | 8/2007 | Stanley et al. |
| 2007/0215601 | A1 | 9/2007 | Frank |
| 2007/0290532 | A1 | 12/2007 | Frank |
| 2008/0011732 | A1 | 1/2008 | Ito et al. |
| 2009/0199676 | A1 | 8/2009 | Kandler |
| 2010/0057304 | A1 | 3/2010 | Kandler |

FOREIGN PATENT DOCUMENTS

| | | |
|---|---|---|
| DE | 100 48 956 C1 | 5/2002 |
| DE | 203 09 877 U1 | 12/2003 |
| DE | 103 58 791 A1 | 8/2005 |
| DE | 103 58 793 A1 | 8/2005 |
| DE | 10 2006 008 919 A1 | 12/2006 |
| DE | 10 2006 031 207 B3 | 11/2007 |
| DE | 10 2007 022 463 A1 | 11/2008 |
| DE | 10 2007 024 141 A1 | 11/2008 |
| EP | 1 491 409 A1 | 12/2004 |
| EP | 1 301 800 B1 | 8/2006 |
| EP | 1 933 461 A1 | 6/2008 |
| FR | 2 868 999 A1 | 10/2005 |
| JP | S58-213313 A1 | 12/1983 |
| JP | S63-305074 A | 12/1988 |
| JP | S64-51564 U | 3/1989 |
| JP | H02-086085 A | 3/1990 |
| JP | SH05-291924 A1 | 11/1993 |
| JP | 2003-535341 A1 | 11/2003 |
| JP | 2005-502859 A1 | 1/2005 |
| JP | 2006-501388 A | 1/2006 |
| JP | 2007-123202 A | 5/2007 |
| JP | 2008-018789 A | 1/2008 |
| WO | 95/13204 A1 | 5/1995 |
| WO | 98/22836 A1 | 5/1998 |
| WO | 01/14171 A1 | 3/2001 |
| WO | 02/06083 A1 | 1/2002 |
| WO | 2004/022409 A2 | 3/2004 |

OTHER PUBLICATIONS

English translation of Notification of the First Office Action issued in counterpart Chinese Application No. 201080040635.4, dated Jun. 5, 2013 (10 pages).

English translation of the International Preliminary Report on Patentability (Chapter I or Chapter II of the Patent Cooperation Treaty) from the International Bureau of WIPO for International Application No. PCT/EP2010/070938 dated Jul. 19, 2012, 9 pages.

Office Action issued in corresponding Japanese Application No. 2012-546451 dated Jan. 30, 2014 and English translation of the same (11 pages).

Office Action issued in corresponding Japanese Application No. 2012-546452 dated Jun. 26, 2014 and English translation of the same (7 pages).

Office Action issued in corresponding Chinese Application No. 201080040635.4 dated Jul. 25, 2014 and English translation of the same (22 pages).

Japanese Office Action dated Oct. 29, 2014 for JP 2012-546452 and English translation of the same. (5 pages).

\* cited by examiner

CAPACITIVE SENSOR ASSEMBLY

CROSS-REFERENCE TO RELATED APPLICATIONS

This application is a National Phase Patent Application of International Patent Application Number PCT/EP2010/070938, filed on Dec. 30, 2010, which claims priority of German Patent Application Number 10 2009 055 426.2, filed on Dec. 30, 2009, which are hereby incorporated herein by reference in their entirety.

FIELD OF THE INVENTION

The invention relates to a capacitive sensor assembly for a motor vehicle.

BACKGROUND

Such a capacitive sensor assembly comprises at least one capacitive sensor element, which is formed by at least one (first) electrical conductor element as electrode and which is connected or is to be connected to an evaluation unit, which detects and evaluates at least one measured parameter depending on the capacitive coupling of the capacitive sensor element to its surrounding, as well at least one (potential leading) electrical reference conductor element, which forms or defines an electrical reference potential (zero potential) when determining said measured parameter or in more general during the capacitive coupling of the capacitive sensor element with its surrounding and which is arranged with a distance from the capacitive sensor element, thus in particular from the first electrical conductor element. The term conductor element is thereby at present being used in general for a singular or multipart electrical conductive element, which can be provided as a cable, flat conductor, an electrical conductor film or in any other form as electrical conductive component (electrical conducting assembly).

The assigned evaluation unit can determine and evaluate in particular the change of a measured value (for instance a measured current) depending on the capacitive coupling of a capacitive sensor element to a reference potential, which can be defined by a suitable vehicle element as for instance components of the vehicle body, components of a vehicle seat or the mentioned electrical heating element, wherein said capacitive coupling and thus said measured value is being influenced by the presence of a vehicle occupant or any other object in the surrounding of the capacitive sensor element. In case of a capacitive sensor element being integrated into a vehicle seat for instance the presence of a vehicle occupant being located on the seat can be herewith determined and also the occupant's condition can be concluded or a child seat can be recognized.

It is known from the U.S. Pat. No. 6,563,231 B1 to provide at least one electrical conductor element as electrode on a sensor mat for forming a capacitive sensor element. The sensor mat is being arranged as occupant detector on a vehicle part in order to be able to determine the occupation of a specific seat of a motor vehicle by a vehicle occupant. in concrete terms, the sensor mat with the electrical conductor element serving as capacitive sensor element is arranged for instance on a seat surface of the motor vehicle seat, and namely in particular between the seat cover and a seat cushion, that means somewhat below the seat cover and above the cushion foam. In order to determine, if a vehicle occupant is located on a vehicle seat being equipped with such a detector, the capacity between the sensor mat and a carrier of a reference potential (zero potential), for example defined by the vehicle floor ("earth") or by at least one reference conductor element being integrated into the sensor mat, is being determined. This has by no means to occur imperatively directly by a (direct) capacity measurement; but it can occur by the measurement of any electrical values, which are linked to the mentioned capacity, the respective measured value thereof thus depends on the capacity (between the sensor mat and a carrier of the reference potential), as for instance by the measurement of measured currents (in or to the electrical conductor element serving as capacitive sensor element), compare also DE 100 48 956 C1 in case of a capacitive sensor assembly being integrated into a steering wheel.

If a vehicle occupant is located on the corresponding vehicle seat, then the resulting capacity is being influenced by the capacitive coupling of the occupant; and the resulting capacity corresponds to a combination (depending on the concrete situation for instance approximately a series connection) of the capacity between the seat surface (or the capacitive sensor element being provided there) and the vehicle occupant as well as the capacity between the vehicle occupant and the reference potential. By integrating thereby a reference conductor element with reference potential as counter electrode into the vehicle seat or into the sensor mat itself, the distance between the carrier of the reference potential and the vehicle occupant to be detected can be reduced and through this the measuring sensitivity can be improved.

With such an arrangement it can also be differentiated, if a vehicle occupant is located directly on the corresponding vehicle seat or if a children seat is attached to the vehicle seat, which in turn occupies a toddler. This determination can be used in order optionally to deactivate for instance by non-occupation or by occupation with a children seat one or multiple of the airbags assigned to the corresponding seat. Thus, a capacitive sensor assembly can be used as occupant detector in order to activate or deactivate safety devices of a motor vehicle, but also for triggering other functions of a motor vehicle, as for instance warning or control functions.

It is furthermore known from practice to arrange on a sensor mat beside at least one electrical conductor element serving as sensor element additionally electrically operating heating conductors, which are arranged with a distance from the first electrical conductor element and which, when under current, produce heat for heating a steering wheel, a vehicle seat or any other vehicle part.

In case of capacitive sensor systems, which comprise besides a capacitive sensor element also at least one electrical heating element and/or at least one reference conductor element, the compliance of a defined distance between the (first) electrical conductor element forming the capacitive sensor element as well as the heating conductors forming the electrical heating element or the respective reference conductor element is of importance in order to obtain reliable statements about the occupation of a seat with a vehicle occupant. In particular the effect of moisture and humidity on the measured values also depends on the distance between sensor element and heating element or sensor element and reference conductor element.

SUMMARY

The problem of the present invention is to provide a capacitive sensor assembly for a motor vehicle which avoids the mentioned disadvantages.

According to an exemplary embodiment of the invention the first electrical conductor element of the sensor assembly forming a capacitive sensor element is provided as (longitudinally extending) outer conductor and surrounds the electrical reference conductor element (defining an electrical reference potential), which forms an inner conductor (and continues along the—optionally curved—extension direction of the outer conductor).

Through this a defined arrangement of a first electrical conductor element forming a capacitive sensor element relative to a reference conductor element is obtained in a simple manner, wherein the arrangement can be specifically designed such that the distance between the first electrical conductor element (outer conductor) and the reference conductor element (inner conductor) remains always constant under operation, or can be designed such that depending on certain outer conditions as for instance pressure, defined distance changes can be possible. The reference conductor element ("potential leading element") defines thereby in particular (as counter electrode to the first conductor element) in each case a reference potential for (capacity) measurements.

For providing defined conditions, it can be in particular provided that the first conductor element completely surrounds the reference conductor element in a cross-sectional plane of the sensor assembly, which intersects the first conductor element and the reference conductor element (for instance essentially vertical in respect to the extension direction of first conductor element and heating conductor), thus encloses in form of a curve closed in the cross-sectional plane.

For a comprehensive applicability of the sensor assembly for instance in order not only to be able to detect the presence of a person in the surroundings, but in order to be able to provide statements about the constitution of the person or in order to be able to recognize a seat occupation by a children's seat, the reference conductor element and the first conductor element can be distanced from each other such that any straight line, which extends in the cross-sectional plane of the sensor assembly, which intersects the first conductor element and the reference conductor element (for instance essentially vertical), can be brought independent on the spatial orientation of the straight line in the cross-sectional plane by parallel displacement in the cross-sectional plane into a position, in which it forms a curve secant of the first conductor element without intersecting the reference conductor element.

The reference conductor element ("potential leading element"/inner conductor) can serve according to a modification simultaneously as an electrical heating conductor (for heating a vehicle component) and is therefore to be operated with a suitable electrical current ("heating current").

According to a preferred exemplary embodiment of the invention the first electrical conductor element as outer conductor forms a longitudinal cover, in which the reference conductor element extends as (longitudinal) inner conductor. Such a design can be realized in particular according to the type of a shielded conductor or a coaxial cable with the reference conductor element as core and the first conductor element as outer cover.

The first conductor element in form of an outer conductor can thereby—as well as optionally the reference conductor element in form of an inner conductor—be formed by a cable network, an electrically conducting film or such.

According to an exemplary modification of the invention a further, second conductor element continues between the first conductor element as outer conductor and the reference conductor element as inner conductor, wherein said second conductor element can in particular serve to shield the first conductor element (outer conductor) and the reference conductor element (inner conductor) against each other. For this the second conductor element can form a so called potential controlled shield ("driven shield"). Such a configuration can be provided in particular according to the type of a triaxial cable or more general of a n-axial cable.

The (cover like) second conductor element continuing between the inner reference conductor element and the outer first conductor element can be formed also as a cable network, electrically conducting film or such.

Thereby the reference conductor element and the second conductor element are advantageously distanced from each other such that any straight line, which extends in the cross-sectional plane of the sensor assembly, which intersects the first and second conductor element as well as the reference conductor element (for instance essentially vertical), can be brought independent on the spatial orientation of the straight line in the cross-sectional plane by parallel displacement in the cross-sectional plane into a position, in which it forms a curve secant of the second conductor element without intersecting the reference conductor element. This corresponds to the distance, which has already been provided previously for the reference conductor element and the first conductor element.

The reference conductor element as inner conductor is advantageously surrounded by a dielectric, which can be formed by a gas, as for instance air, but also by a (insulating) solid.

According to an exemplary variant the dielectric can be compressed by the effect of an outer pressure such that the configuration of the sensor assembly can be changed specifically pressure dependent, what in turn influences the resulting capacity and allows conclusions about the pressure conditions in the area of the sensor assembly. Thus, a material can be used as dielectric, which substantially deforms under an outer pressure, which exceeds a certain minimal pressure, what allows for instance conclusions about the weight of a vehicle occupant, which has taken a seat on a vehicle seat equipped with the sensor assembly. Besides a differentiation between heavier and lighter vehicle occupants, which can be of importance for the selection of specific inflation behavior of an airbag, in particular the differentiation between an occupation with a children seat and a (small) vehicle occupant can be hereby supported.

According to an exemplary modification the deformability of the dielectric can be location dependent, for instance by using different materials for forming the dielectric surrounding the reference conductor element in different areas.

According to another exemplary variant of the invention a material is being used as dielectric, which is not substantially deformable at pressures occurring at normal operation of the sensor assembly, thus for instance in case of a sensor assembly integrated into a vehicle seat under pressures caused by vehicle occupants. Through this it is secured that (capacity) measurements provide pressure independent results.

An (insulating) protective cover can be provided for protecting the sensor assembly and in particular a dielectric surrounding the reference conductor element from moisture, wherein said cover covers at least the reference conductor element as inner conductor (as well as optionally a dielectric enclosing the reference conductor element). Such a protective cover can continue for instance between the first conductor element as outer conductor and the reference conductor element as inner conductor or also beyond the outer conductor; said cover can however also (alternatively or additionally) continue on the outer surface of the sensor assembly. The protective cover can be formed by an additional cover element or can be directly integrated into the arrangement for instance in form of an insulating lacquer.

The first conductor element can be provided in particular with an alternating current (as measurement current) in order to allow reliable results also at moisture by evaluating the reality part, the imaginary part and/or the effective value of the current.

The sensor assembly according to the invention can be in particular a part of a motor vehicle seat in order to be able to recognize a seat occupation; or it can be part of a steering wheel in order to be able to detect a hand rest of a vehicle driver on the steering wheel. Finally, it can also be integrated into a safety belt system of a motor vehicle or in any other motor vehicle assembly.

BRIEF DESCRIPTION OF THE DRAWINGS

Further details and advantages of the invention will become apparent with the following description of the examples by the means of the figures.

DETAILED DESCRIPTION

Figure 1:
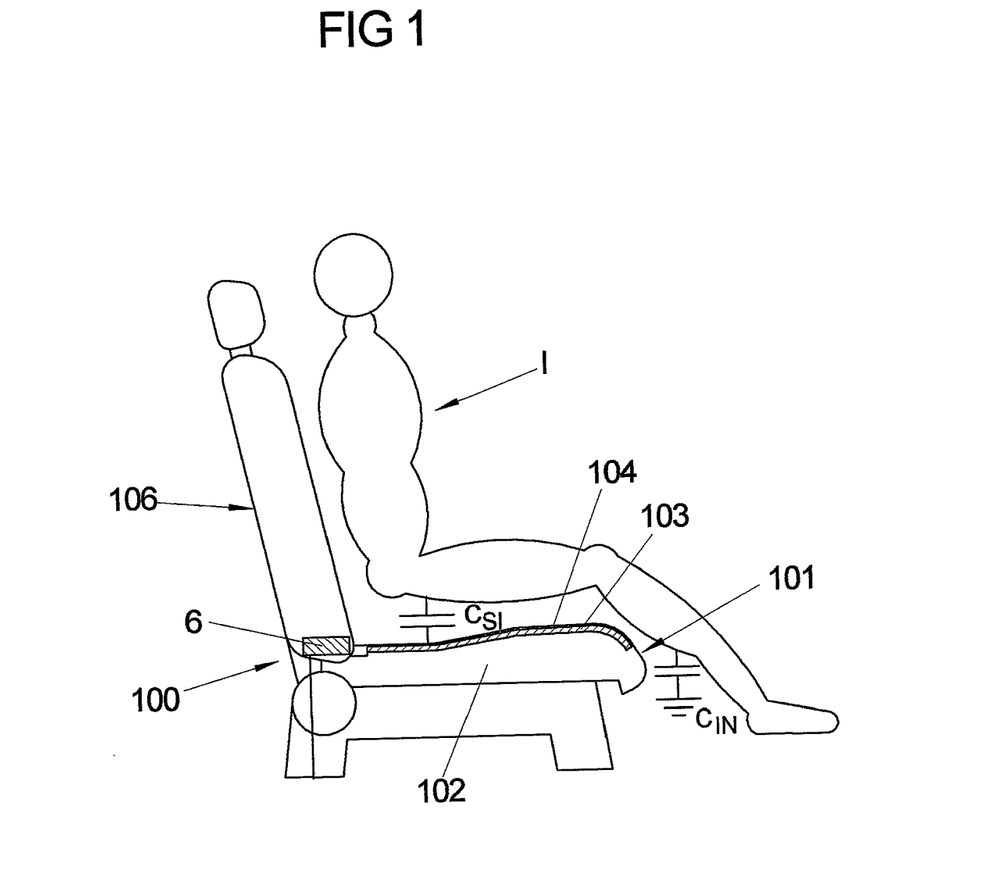
FIG. 1 shows a schematic illustration of a motor vehicle seat with a sensor mat, which includes at least one capacitive sensor element.

FIG. 1 shows a motor vehicle seat 100, which comprises a seat cushion 101 provided on a seat underframe as well as a backrest 106 being hinged (foldable) to a seat underframe such that a vehicle occupant I being located on the vehicle seat sits on the one hand on the seat cushion 101 and can be supported on the other hand by its back on the backrest 106. The cushion 101 comprises for instance an upholstery 102 and a cover 104, wherein hereby in the area of the seat surface of the seat cushion 101 a sensor mat 103 is arranged between the seat upholstery 102 and the cover 104, wherein said sensor mat comprises at least one capacitive sensor element. For this purpose a first electrical conducting element, subsequently simply designated as first conductor element or as first electrical conductor, can be integrated into the sensor mat, wherein said first element forms an electrode of the capacitive sensor element and is being connected to an evaluation unit 6, in order to be able to determine the capacity between the sensor mat 103, more specific the at least one capacitive sensor element (electrode) being arranged on the sensor mat 103, and a reference potential of the motor vehicle containing the vehicle seat.

The evaluation unit 6 can in turn interact with a control device (not shown), which depending on the occupation of the vehicle seat with an occupant I and optionally depending on the size and the weight of the occupant as well as depending on the fact if the corresponding occupant sits directly on the vehicle seat 100 or if it is a toddler being housed by a children seat, activates or deactivates assigned safety devices of the vehicle seat, as for instance an airbag.

In case of the arrangement of the type shown in FIG. 1 the capacity between the sensor mat 103 and the reference potential is essentially determined by the combination of two capacities, namely the capacity $C_{SI}$ between the sensor mat 103 and the vehicle occupant I as well as the capacity $C_{IN}$ between the vehicle occupant and the reference potential.

Regarding suitable possibilities to couple the vehicle occupant I to the reference potential such that a particularly exact determination of the occupation of the vehicle seat 100 is possible as well as regarding the (capacity) measurement it is pointed for further details to the U.S. Pat. No. 6,563,231 B1.

At present the design of the electrical conductor is in particular important, which forms the electrode of the sensor mat 103, to which the capacity measurements required for detecting the seat occupation are related to.

According to the cross-sectional illustration of FIG. 2 a first electrical conductor being arranged as a part of a sensor mat 103 below a seat cover 104, wherein said conductor forms a capacitive sensor element or an electrode of a sensor mat, is provided as an outer conductor, which houses an electrical reference conductor element serving for defining or forming an electrical reference potential (subsequently simply designated as reference conductor 3) as inner conductor and which encloses it (completely) cover like. The reference conductor 3 as inner conductor continues thereby longitudinally extending (vertical to the plane of FIG. 2) and the first conductor 1 forming the capacitive sensor element continues (also vertical to the plane of the FIG. 2) along the reference conductor 3. In concrete terms, the first conductor 1 as outer conductor and the reference conductor 3 as inner conductor form according to the configuration of FIG. 2 an arrangement of the type according to a shielded conductor, for instance a coaxial cable, with the inner conductor as cable core and the outer conductor as outer cover. The reference conductor 3, which serves as a (seat integrated) reference potential element, which (for instance instead of the vehicle floor frequently provided therefore) forms/defines a reference potential (for capacity determination), can thereby at present be provided simultaneously as a (being electrically operable by current) heating conductor (for heating the seat 100 or the seat cushion 101). The sensor mat 103 forms then at the same time a heating mat.

The reference conductor 3 and the first conductor 1 are thereby distanced from each other such that any straight line g (as indicated by a dotted line in FIG. 2), which extends in the cross-sectional plane of the sensor assembly, which intersects the first conductor 1 and the reference conductor 3, can be brought independent on the spatial orientation of the straight line g in the cross-sectional plane by parallel displacement in the cross-sectional plane into a position, in which it forms a curve secant s of the first conductor 1 (thus connects two points of the first conductor 1 being distanced from each other in the cross-sectional plane with each other) without intersecting the reference conductor 3.

The reference conductor 3 is surrounded by an insulator or dielectric 4, which extends between the reference conductor 3 as inner conductor and the first conductor 1 as outer conductor and which in the embodiment is surrounded by a (moisture tight) protective cover 5b towards the outer first conductor 1. The reference conductor 3 serves as heating conductor at the same time to produce heat when under current with electrical current such that hereby for instance the seat surface of a seat cushion can be heated. The material of the dielectric 4 is hereby selected such that a sufficient part of the heat produced in the heating conductor 3 (can enter through the dielectric 4 and) is provided for heating the seat cushion 101.

The first conductor 1 being provided as cover like outer conductor is adjacent (radially) outwards to the reference conductor 3 and the dielectric 4, here surrounded by a protective cover 5b, wherein said first conductor is being formed by a conductive material at present in form of a cable network 11 or alternatively in form of an electrically conducting film or a conductor path. A (moisture tight) protective cover 5a can also be provided on the outside of the outer first conductor 1.

As a result the capacitive sensor element (first conductor 1) and the occupant I or its body part facing the sensor element form a first condenser (of the capacity $C_{SI}$) and the occupant I as well as an element defining the reference potential (here the reference conductor 3) form a second condenser (of the capacity $C_{IN}$), if an occupant I is present on the seat 100 of FIG. 1. The two condensers are approximately connected in series.

The evaluation unit 6 is connected to the sensor assembly 1, 3 and can detect a measured value (for instance a measured current) or a change of a measured value as consequence of a capacitive coupling caused by a vehicle occupant I between the capacitive sensor element (first conductor 1) and the reference potential (defined by the reference conductor 3). In concrete terms, for instance the strength, a frequency, the amplitude and/or the phase of a measured current can be determined. For a possible concrete design of an evaluation unit 6 it is being pointed to FIG. 4 and the according description.

In an embodiment the dielectric 4 surrounding the reference conductor 3 as inner conductor is on one hand sufficiently rigid designed such that it cannot be deformed by forces or pressures occurring during normal operation of the sensor assembly. Forces and pressures occurring under normal operation are thereby in particular such which are caused by a vehicle occupant I sitting on the vehicle seat 100, compare FIG. 1. In this case the dielectric 4 provides that the (radial) distance between the first conductor 1 as outer conductor and the reference conductor 3 as inner conductor remains always constant independent on the occupation of the corresponding vehicle seat such that force or pressure impact does not substantially influence the resulting capacity (by using the outer conductor 1 as capacitive sensor element).

There is on the other hand the possibility to directly select a (insulating) material for the dielectric 4, which is deformed depending on the weight of a vehicle occupant sitting on the vehicle seat 100. Thus, the material of the dielectric 4 can be for instance selected such that it is not being deformed by the action of the weight of the children seat including a toddler being located therein, but a substantial deformation occurs only at a force or pressure threshold, which is above the weight of a children seat with toddler and for instance corresponds to the weight of a small female occupant (so called 5% woman).

Since a change of the distance between the first conductor 1 as outer conductor and the reference conductor 3 as inner conductor is connected to a deformation of a dielectric 4, accordingly also the values of the capacities relating to the first conductor 1 as capacitive sensor element change. As a result the sensor assembly can thus also be designed by suitable selection of the dielectric 4 additionally as a pressure sensitive sensor (pressure sensor) in order to gain herewith additional information about a vehicle occupant being located on the assigned vehicle seat 100.

If required also a location depending or direction depending pressure sensitivity of the sensor assembly can be achieved by using different (insulating) materials for different areas 41, 42, 43, 44 of the dielectric 4. Depending on the fact, in which areas 41, 42, 43, 44 materials with comparatively large compressibility (comparatively large compressibility or small compression module) as well as materials with comparatively low compressibility (for instance small compressibility or large compression module) are used, it can be achieved that distance changes between the first conductor 1 as external conductor and the reference conductor 3 as internal conductor depend on the location and/or the direction of a force acting on the sensor assembly.

It can thereby also be provided to use a material as dielectric which reacts to pressure impact with a certain timely delay (by deformation) such that by a time dependent measurement of the capacity or measured parameters connected herewith (thus depending on the capacity) pressure influences can be recognized, evaluated and considered. A suitable selected reaction delay allows in particular a phase wise measurement, wherein at first (before the delayed deformation of the dielectric as a consequence of a force impact) purely capacitive coupling changes—as consequence of an occupation of the seat—are detected and subsequently (during or after deformation of the dielectric) the influence of a deformation of the dielectric onto the capacitive coupling is detected, whereby additional data for detecting the seat occupation as well as differentiation between different large/heavy vehicle occupant is provided.

The material of the dielectric 4 can be selected such that it extends or contracts at temperature changes, thus by a change of the surrounding temperature and/or by a change of the temperature produced by the reference/heating conductor 3 when in operation—depending if a temperature increase or a temperature decrease takes place—such that the distances between the components of the sensor assembly, in particular between the outer, first conductor 1 serving as capacitive sensor element and the reference/heating conductor 3 changes. The effects connected herewith onto the capacity detected at predetermined conditions (occupation or non-occupation of the seat as well as optionally constitution of an occupant occupying the seat) allow a conclusion about the surrounding temperature or—when operating the reference conductor 3 as heating conductor—on the temperature produced by the heating conductor. Herewith devices of a motor vehicle, as for instance the heating device itself or a climate device, can be controlled or regulated and on the other hand temperature influences onto the sensor assembly can sufficiently be considered.

Figure 2:
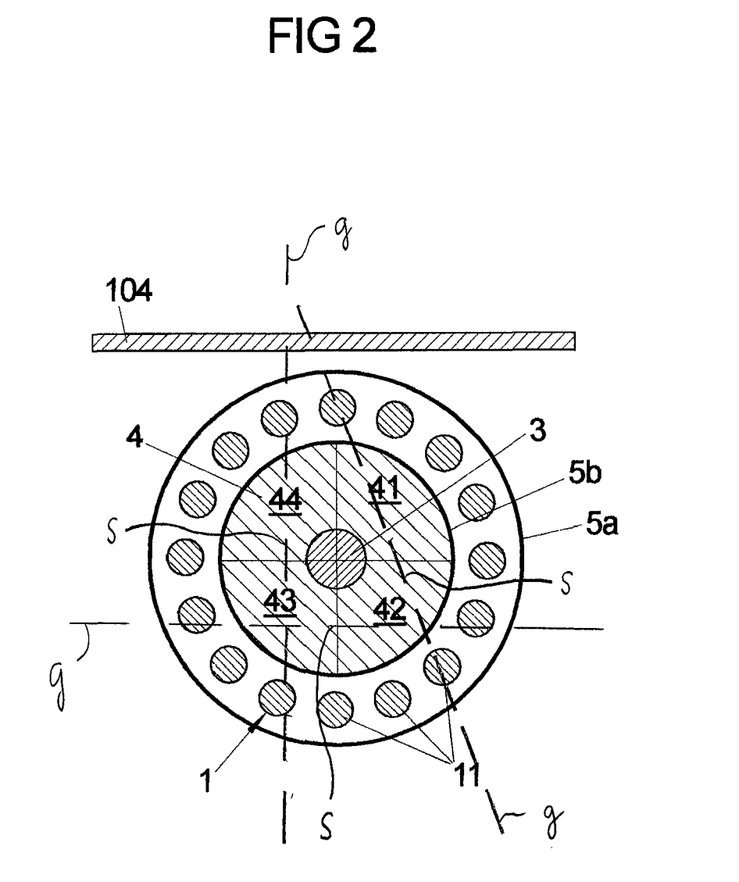
FIG. 2 shows a first embodiment of an electrical conductor for forming a capacitive sensor element.
Figure 3:
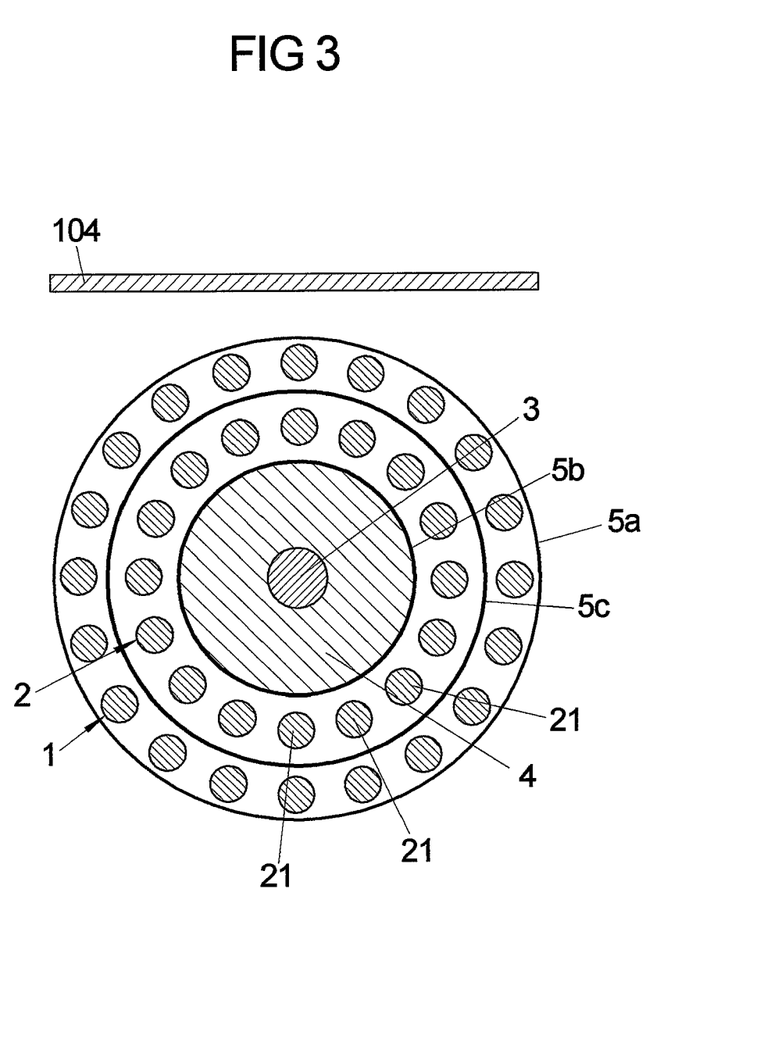
FIG. 3 shows a second embodiment of an electrical conductor for forming a capacitive sensor element.

FIG. 3 shows a modification of the sensor assembly of FIG. 2 according to which an additional second conductor 2 extends between the first conductor 1 as outer conductor and the reference conductor 3 as inner conductor, wherein said second conductor is here (also) formed as cable network 21 and which surrounds the reference conductor 3 and the dielectric 4 cover like. Through this the first conductor 1 in form of an outer conductor serving as capacitive sensor element can be shielded against the reference conductor 3 in form of an inner conductor such that distance changes between the first conductor 1 and the reference conductor 3 have no substantial back impact on the resulting capacity. The shield formed by the second conductor 2 can be thereby formed as a so called potential controlled shield ("driven shield").

Furthermore, a further (optionally moisture tight) protective cover 5c can continue between the first conductor 1 and the second conductor 2. Thereby one or multiple protective covers can be provided in practice depending on the need of the three protective covers 5a, 5b, 5c shown in FIG. 3.

In summary, the sensor assembly according to FIG. 3 is formed according to the type of a triaxial cable with the reference conductor 3 as cable core, the first conductor 1 as outer cover and the second conductor 2 as middle cover, which encloses the reference cover 3/cable core and which in turn is being enclosed by the outer cover formed by the first conductor 1.

Figure 4:
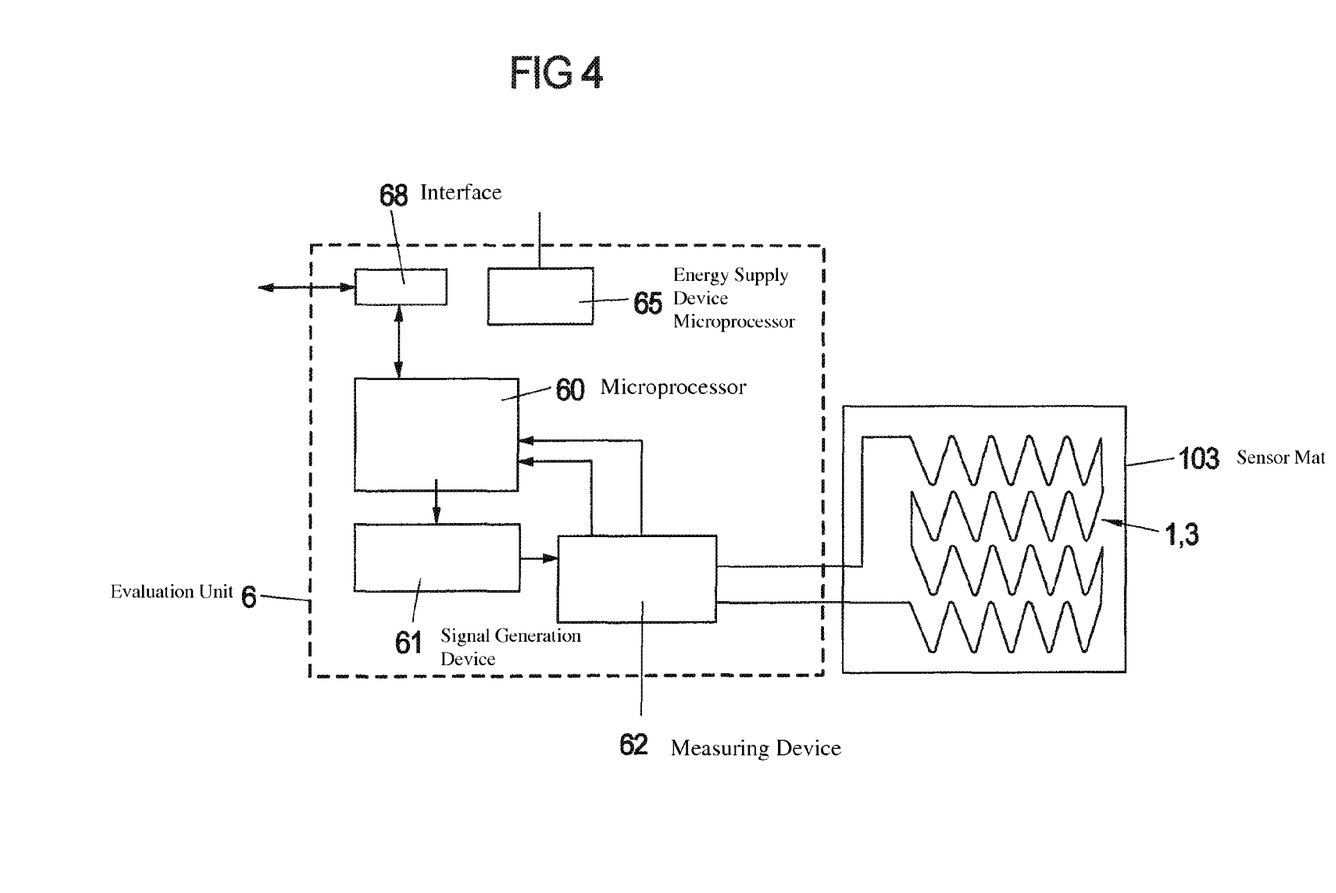
FIG. 4 shows a capacitive sensor element together with an assigned evaluation unit.

FIG. 4 shows a sensor assembly 1, 3 of the type illustrated in cross-section in FIG. 2 or 3 as part of a sensor mat 103 together with a downstream arranged evaluation unit 6 for evaluating exit signals produced by the sensor assembly 1, 3.

The evaluation unit 6 can thereby serve on one hand to detect in a simple manner the capacity of the sensor mat 103 in relation to the reference potential, which is determined by occupation of the corresponding vehicle seat 100 with a vehicle occupant I, compare FIG. 1, by the connection (for instance connection in series) of the capacity $C_{SI}$ between the sensor mat 103 and the vehicle occupant I as well as the capacity $C_{IN}$ between the vehicle occupant I and the reference potential.

According to the concrete embodiment shown in FIG. 4, the first conductor 1 (outer conductor) of the sensor assembly as capacitive sensor element is provided with an alternating current, for instance a sinus signal of a defined frequency of about 120 kHz. For this purpose an energy supply device 65 is assigned to the evaluation unit 6; and in a signal generating device 61 a (sinus like) alternating current is generated with a defined phase and amplitude and is directed to the sensor mat 103 or the sensor assembly 1, 3 (more precise to the at least one outer conductor 1 forming a capacitive sensor element). The generation of said sinus signal can be controlled by a microprocessor 60 of the evaluation unit 6.

By means of a measuring device 62, which is integrated into an electrical connecting line connected to the sensor assembly 1, 3 and which is located in the embodiment between the signal generating device 61 and the sensor assembly 1, 3 or the sensor mat 103, the actual provided alternating current is measured and the measured result is provided to the microprocessor 60 of the evaluation unit 6. By comparing parameters of the alternating current generated in the signal generating device 61, as for instance amplitude and phase, with the corresponding parameters measured actually at the measuring device 62, thus for instance amplitude and phase, deviations of said parameters effected by the sensor mat 103 or sensor assembly 1, 3 and their capacitive interaction with the surrounding (for instance with the vehicle occupant) can be determined.

For this reason for instance the active current part (thus the phase like part or reality part of the alternating current forming the basis of the alternating voltage), in particular as basis for the determination of a phase shift, and/or the reactive current part (imaginary part of the alternating current) and/or the quadrature part or effective value of the current, in particular as basis for determining the amplitude, are detected.

The capacities of the sensor assembly in respect to a reference potential (reference potential) can be concluded in particular from the amplitude deviations and from deviations of the phase it can be concluded to possible leakage current, which are caused by humidity or moisture in the seat.

Hereby, when evaluating measured capacities or measured values being in relation thereto, additionally humidity and moisture in the seat can be considered for determining the occupation of a seat, for instance for distinguishing the status "non-occupied", "occupied directly by a vehicle occupant" and "occupied by a toddler being housed by a children seat", what prevents misinterpretations of the measured results in respect to the seat occupation.

The information obtained about the seat occupation can be transferred via an interface 68 to a control device in order to control dependent thereof vehicle systems, in particular occupant safety systems as for instance an airbag system.

Figure 5:
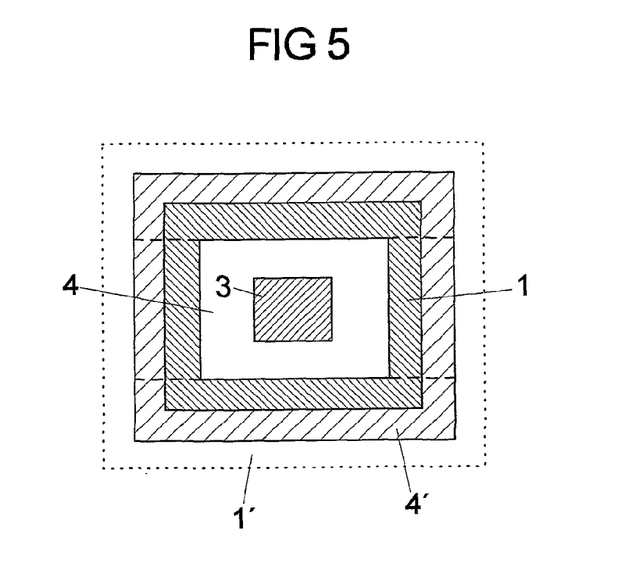
FIG. 5 shows a third embodiment of an electrical conductor for forming a capacitive sensor element.

FIG. 5 shows a capacitive sensor assembly, which comprises a capacitive sensor element 1 in form of an outer conductor, which surrounds a (optionally serving as a heating conductor) reference conductor 3 as inner conductor, wherein a dielectric extends between the reference conductor 3 as inner conductor and the capacitive sensor element 1 as outer conductor in cross-section. The arrangement shown in FIG. 5, in particular its first conductor 1 as outer conductor as well as the reference conductor 3 and the dielectric 4, extends thereby vertical to the plane of FIG. 5.

The arrangement corresponds in so far to the principle construction of the arrangement of The arrangement corresponds in so far to the principle design of the arrangement of FIG. 2 with the difference that at present it is a system constructed of layers, that—according to the type of a flat conductor—consists of a multitude of layers being arranged on each other (for instance laminated) as being subsequently explained in more detail.

In FIG. 5 it is thereby furthermore indicated that the arrangement of the outer, first conductor 1, the inner reference conductor 3 as well as the dielectric 4 being there between can be surrounded outside by a further dielectric 4', to which again an electrical conductive element 1' can be adjacent and so on. Thus, basically n times electrical conductor 1, 1', ... can follow each other outwards, wherein said conductors are being in each case separated from each other by a suitable insulating layer.

Interfaces between the layers arranged on each other (laminated on each other) are indicated by a dotted line in FIG. 5, which form the sensor assembly of FIG. 5.

Figure 6:
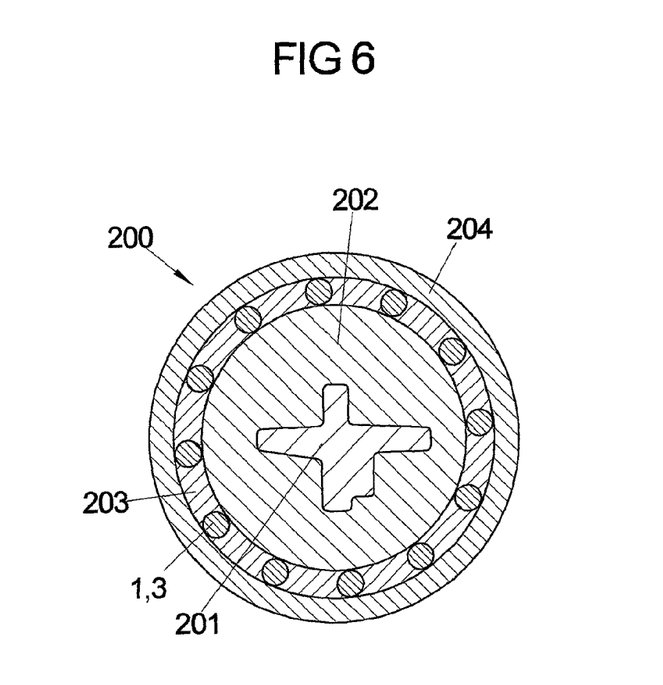
FIG. 6 shows a schematic cross-section through a motor vehicle steering wheel with capacitive sensor element.

FIG. 6 shows finally a cross section of a steering wheel 200 in the area of the steering wheel rim with a capacitive sensor assembly 203 being arranged thereon.

According to FIG. 6 the steering wheel 200 comprises in the area of the rim a skeleton 201 surrounded by a cover 202, for instance steering wheel foam, and with a cover 204 defining the outer surface of the steering wheel rim, for instance made of leather.

Beyond the cover 202, however, below the outer surface (defined by the cover 204) the capacitive sensor assembly 203 is arranged, which comprises a multitude of arrangements 1, 3 of the type shown in FIG. 2 or 3 or 5, thus in each case a capacitive element formed as an outer conductor and a reference conductor/heating conductor as inner conductor.

The invention claimed is:

1. A motor vehicle steering wheel with a steering wheel body and at least one capacitive sensor assembly provided on the steering wheel body, the capacitive sensor assembly being for recognizing a hand rest of a vehicle driver on the steering wheel, wherein the capacitive sensor assembly is arranged between a cover surrounding a steering wheel skeleton and a cover forming an outer surface of the steering wheel and comprises:
   a capacitive sensor element, which comprises at least one first electrical conductor element, the capacitive sensor element being configured to be connected to an evaluation unit, which detects and evaluates at least one measured value depending on the capacitive coupling of the capacitive sensor element to its surrounding, and
   a reference conductor element, which defines an electrical reference potential and which is being arranged with a distance from the first electrical conductor element,
   wherein the first electrical conductor element is designed as an outer conductor element which surrounds the reference conductor element as the inner conductor,
   wherein in addition a second conductor element extends between the first conductor element as the outer conductor element and the reference conductor element as the inner conductor, and
   wherein the first and the second conductor element as well as the reference conductor element form an n-axial cable design.

2. The sensor assembly according to claim 1, wherein the first conductor element completely surrounds the reference conductor element as viewed in a cross sectional plane of the sensor assembly, which extends perpendicular to and intersects the first conductor element and the reference conductor element.

3. The sensor assembly according to claim 2, wherein the first conductor element encloses the reference conductor element as a closed curve in the cross-sectional plane of the sensor assembly, which extends perpendicular to and intersects the first conductor element and the reference conductor element.

4. The sensor assembly according to claim 1, wherein the reference conductor element and the first conductor element are distanced from each other as viewed in a cross-sectional plane of the capacitive sensor assembly that extends perpendicular to and intersects the first conductor element and the reference conductor element such that a straight line, which intersects the first conductor element and the reference conductor element, can be brought is shiftable independent of the spatial orientation of the straight line in the cross-sectional plane by parallel displacement in the cross-sectional plane in a direction orthogonal to the straight line into a position in which it forms a curve secant of the first conductor element without intersecting the reference conductor element.

5. The sensor assembly according to claim 1, wherein the first conductor element as outer conductor element and the reference conductor element as inner conductor form a coaxial cable design.

6. The sensor assembly according to claim 5, wherein the second conductor element is provided as potential controlled shield.

7. The sensor assembly according to claim 1, wherein the first conductor element as outer conductor element and the reference conductor element as inner conductor form a shielded cable design.

8. The sensor assembly according to claim 1, wherein the second conductor element shields the first conductor element and the reference conductor element against each other.

9. The sensor assembly according to claim 8, wherein compressibility of the dielectric is dependent on at least one of location and direction of force applied thereto.

10. The sensor assembly according to claim 1, wherein a reference conductor element is at least partially surrounded by a dielectric.

11. The sensor assembly according to claim 1, wherein the dielectric is compressable under pressure.

12. The sensor assembly according to claim 1, wherein the reference conductor element serves at the same time as heating conductor for heating at least one vehicle component.

13. The sensor assembly according to claim 1, wherein the first conductor is provided with an alternating current and a measuring device is provided for determining parameters of the alternating current in order to determine the effect of the sensor assembly on the alternating current.

14. The sensor assembly according to claim 1 wherein the sensor assembly is a part of a sensor mat.

15. The sensor assembly according to claim 1, wherein a sensor mat serves as a heating mat for heating at least one vehicle component.

16. The sensor assembly according to claim 1, wherein the sensor assembly forms furthermore a temperature sensor.

17. The sensor assembly according to claim 1, wherein the sensor assembly formed and provided for being assembled into a motor vehicle part in order to recognize herewith the presence of a vehicle occupant in a certain seat.

18. The sensor assembly according to claim 1, wherein the sensor assembly is formed and provided for being assembled into a motor vehicle seat and/or a steering wheel and/or a safety belt system.

* * * * *